United States Patent
Matsumura et al.

(10) Patent No.: US 6,521,829 B2
(45) Date of Patent: Feb. 18, 2003

(54) ELECTROMAGNETIC WAVE ABSORBING SHEET

(75) Inventors: Kazuhito Matsumura, 1-8, Wakakusa No. 2 Housing, 1-12, Wakakusa 2-chome, Utsunomiya City, Tochigi Prefecture (JP); Kenichi Yoshida, Osaka (JP); Tohru Iwai, Osaka (JP); Hidekazu Nakata, Utsunomiya (JP); Masato Yoshizawa, Utsunomiya (JP)

(73) Assignees: Japan Science and Technology Corporation, Saitama Prefecture (JP); Sumitomo Electric Industries, Ltd., Osaka Prefecture (JP); Kanto Wire Products Corporation, Tochigi Prefecture (JP); Kazuhito Matsumura, Tochigi Prefecture (JP)

(*) Notice: Subject to any disclaimer, the term of this patent is extended or adjusted under 35 U.S.C. 154(b) by 0 days.

(21) Appl. No.: 10/117,092

(22) Filed: Apr. 8, 2002

(65) Prior Publication Data

US 2002/0148626 A1 Oct. 17, 2002

Related U.S. Application Data

(63) Continuation of application No. 09/533,587, filed on Mar. 23, 2000, now abandoned.

(30) Foreign Application Priority Data

Mar. 25, 1999 (JP) ............................................. 11-080893

(51) Int. Cl.$^7$ ................................................. H05K 9/00
(52) U.S. Cl. ................................ 174/35 MS; 29/419.1; 428/624; 428/626
(58) Field of Search .......................... 179/35 MS, 35 R; 361/816, 818; 428/624, 625, 626; 29/600, 419.1

(56) References Cited

U.S. PATENT DOCUMENTS

| RE28,470 E | 7/1975 | Webber ..................... 29/180 R |
| 4,647,495 A | 3/1987 | Kanayama et al. .......... 428/246 |
| 4,749,625 A | 6/1988 | Obayashi et al. .......... 174/35 R |
| 5,539,148 A | 7/1996 | Konishi et al. ............ 174/35 R |
| 5,972,814 A | 10/1999 | Schild, III et al. .......... 442/377 |
| 6,249,941 B1 | 6/2001 | Krupnik et al. ............... 29/4.51 |

FOREIGN PATENT DOCUMENTS

| JP | 64-82696 | 3/1989 | ............... 174/35 R |
| JP | 2-12897 | 1/1990 | ............... 174/35 R |
| JP | 2-12898 | 1/1990 | ............... 174/35 R |
| JP | 2-278897 | 11/1990 | ............ 174/35 MS |
| JP | 3-194999 | 8/1991 | ............ 174/35 MS |

Primary Examiner—Anthony Dinkins
Assistant Examiner—Carmelo Oliva
(74) Attorney, Agent, or Firm—Wenderoth, Lind & Ponack, L.L.P.

(57) ABSTRACT

An electromagnetic wave absorbing sheet S is disclosed. The absorbing sheet S includes a laminated-structural layer of a nonwoven fabric sheet 10 and a metallic layer 22 such as iron, aluminums, copper or their alloy which is disposed on a bottom surface of the metallic layer 22. The nonwoven fabric sheet 10 includes non-metallic fibers 16 having no binding faculty, non-metallic binding fibers 14 having binding faculty which are melted by heat to bind neighboring fibers, and metallic fibers 12 having an irregular cross-section and being produced by shaving a metallic wire or rod, that are dispersed uniformly in the nonwoven fiber layer or layers.

10 Claims, 5 Drawing Sheets

ELECTROMAGNETIC WAVE ABSORBING SHEET

This application is a continuation patent application of U.S. patent application Ser. No. 09/533,587 filed Mar. 23, 2000 now Abandoned.

BACKGROUND OF THE INVENTION

1. Field of the Invention

This invention is an electromagnetic wave absorbing sheet, which can effectively absorb electromagnetic waves in a frequency range over 1 GHz.

2. Description of the Prior Art

With the recent advanced technology, various electromagnetic machines are widely used. There is a possibility that electromagnetic waves radiated from these electromagnetic machines have an influence on a control and performance of the electronic machines and a daily life.

Various devices have been proposed such as mounting a shield around a radiator of electromagnetic waves or other devices have been provided at the electronic machines to prevent leakage of electromagnetic waves.

In addition, various techniques have been proposed to reflect or receive the radiated electromagnetic waves for the purpose of avoiding the influence of the emitted electromagnetic waves.

Normally, an electromagnetic wave receiver which consists mainly of magnetic material such as ferrite is used near a frequency range between 10 MHZ–1 GHz, and conductive material such as carbon, magnetic material such as carbonyl iron, metallic fiber, conductive fiber and conductive paint are used in a frequency range over 1 GHz.

A nonwoven fabric sheet comprising metallic fibers for absorbing electromagnetic waves has been proposed, for example, Japanese Patent Publication Nos. 12898/1990 and 307268/1997.

The conductive high polymer fibers are metallic fibers, each fiber having a diameter of 20 $\mu$mm and a length of 5 mm, which is described in Japanese Patent Publication No. 12898/1990.

The metallic fibers, each fiber having a diameter of 10–100 $\mu$m, a length of 1–5 mm and being penetrated into a pressure-molded resin, are described in Japanese Patent Publication No. 188190/1993.

The metallic fibers, each fiber having a length more than 1 mm and a thickness less than $\frac{1}{10}$ of the length, are described in Japanese Patent Publication No. 288684/1996.

In view of the fact that the fibers of the nonwoven fabric sheets for absorbing electromagnetic waves are relatively linear, not easily got caught with each other, hardly cut off in a manufacturing process and can be arranged along the nonwoven fabric sheet which is being produced.

The production stage of any absorbing sheet for electromagnetic waves, however, is very complicated so that the cost of the produced absorbing sheet increases.

A wire diameter of each metallic fiber is substantially uniform, and a length thereof is also uniform so that reflecting attenuation effect of incident electromagnetic waves is remarkably different when a plane of polarization of electromagnetic wave is in parallel with a longitudinal direction of the absorbing sheet and when the plane thereof is vertical to the absorbing sheet.

There is another annoying problem that absorption quantity of the electromagnetic wave is different with reference to a relationship between the direction (longitudinal direction) of the absorbing sheet and the plane of polarization thereof, and that the absorbing quantity is large when the plane of polarization is in parallel with the longitudinal direction of the absorbing sheet (hereinafter referred to as heterotrophy).

It should be appreciated that an induction ratio of the conventional electromagnetic wave absorbing sheet is remarkably different when the plane of polarization of the electromagnetic waves is in parallel to the longitudinal direction of the absorbing sheet and when the plane is vertical to the absorbing sheet.

Heterotrophy is described in the paper of "International Symposium on Electromagnetic Compatibility in Nagoya", Sep. 8–10, p. 775, 1989, Tetsuji Inui et al.).

The metallic fiber enclosed in the nonwoven fabric sheet has a diameter of 8 $\mu$m, a length of 40 mm and a mass ratio of 0.3–3 wt %, and it is considered that the metallic fiber causes heterotrophy.

Any of the conventional electromagnetic wave sheets has a drawback that a special design has to be worked out in order to obtain a full absorbing performance for both parallel and vertical polarization planes of the electromagnetic wave.

SUMMARY OF THE INVENTION

A principal object of this invention is to provide an electromagnetic wave absorbing sheet which, comprises a nonwoven fabric sheet including one or a plurality of nonwoven fiber layers, each layer comprising non-metallic fibers having no binding faculty, non-metallic binding fibers having binding faculty which are melted by heat to bind neighboring fibers, and metallic fibers having an irregular shape in cross-section and being produced by shaving a metallic wire or rod, that are dispersed uniformly in the nonwoven fiber layer or layers; and a metallic layer having electromagnetic wave reflecting faculty and disposed on an outer bottom surface of the nonwoven fiber layer or layers.

Another object of this invention is to provide an electromagnetic wave absorbing sheet, which can be provided at a given radiator of electromagnetic waves.

Still another object of this invention is to provide an electromagnetic wave absorbing sheet, which can be fabricated at a low cost.

BRIEF DESCRIPTION OF THE DRAWINGS

These and other advantages of this invention will become more apparent from the following detailed description thereof when taken in conjunction with the accompanying drawings.

DETAILED DESCRIPTION OF A PREFERRED EMBODIMENT

Referring to the accompanying drawings in which like numerals designate the like parts throughout the several view thereof, there is shown an electromagnetic wave absorbing sheet S in FIGS. 1–4.

The absorbing sheet S comprises a laminated-structural layer of a nonwoven fiber sheet 10 and a metallic layer 22. The nonwoven fiber sheet 10 includes non-metallic fibers 16 having no binding faculty, non-metallic binding fibers 14 having binding faculty which are melted by heat to bind neighboring fibers, and metallic fibers 12 having an irregular cross-section and being produced by shaving a metallic wire or rod, that are dispersed uniformly in the nonwoven fiber layer or layers.

A metallic layer 22 such as iron, aluminums, copper or their alloy and having electromagnetic wave reflecting faculty is disposed on a bottom surface of the nonwoven fabric 10 directly or with a spacing layer 18 which does not contain the metallic fibers.

Figure 2:
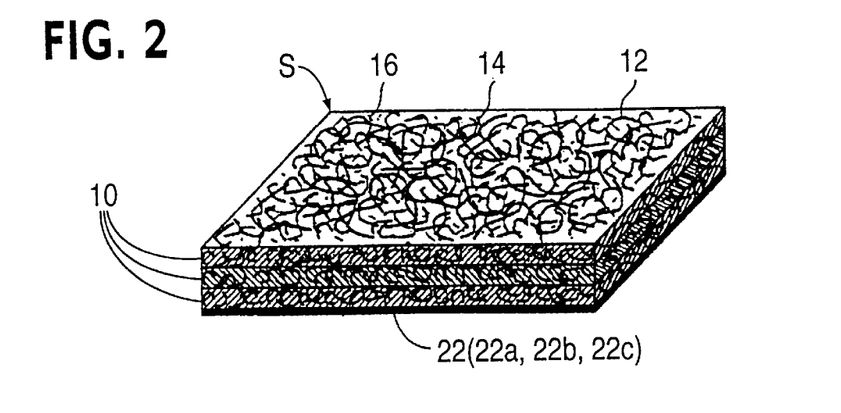
FIG. 2 is a perspective view, partly in section, of an electromagnetic wave absorbing sheet of this invention having a plurality of nonwoven fabric sheets, which are integrally provided on a back surface of the absorbing sheet shown in FIG. 1.

As shown in FIG. 2, a plurality of the nonwoven fiber sheets 10 may be provided in order to change an amount of the metallic fibers in each sheet.

The fiber material 16 is inorganic fiber and/or organic fiber. The inorganic fiber is ceramic fiber comprising glass fiber and/or alumina and silica. Polyester fiber is preferable for the organic fiber. A mixture ratio of the binding fiber 14 to the fiber material 16 is in a range between 10–40% in order to have a flexibility thereof.

The shaved metallic fiber 12 is made of ferritic stainless steel, iron or copper, a thickness of which is in a range between 10–70 $\mu$m, mostly in a range between 30–50 $\mu$m, a length is in a range between 1–50 mm, mostly in a range between 10–30 mm, and the nonwoven fabric sheet 10 contains 100–500 pc. /cm$^3$.

Figure 4:
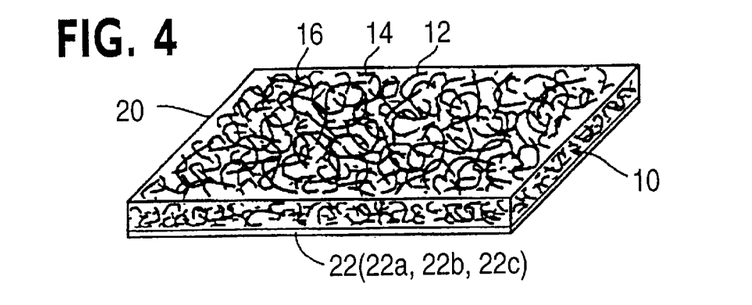
FIG. 4 is a perspective view of an electromagnetic wave absorbing sheet that is covered with a high polymer membrane.

The above metallic layer 22 may be iron plate 22a, metallic foil 22b or metallic mesh 22c. As shown in FIG. 4, an exposed surface of the nonwoven fabric sheet 10 may be totally covered with a high polymer membrane 20 in order to prevent submersion into the nonwoven fabric sheet 10. Accordingly, water submersion can be avoided to obtain a stable absorption performance of the electromagnetic wave can be obtained even under a wet condition.

EXAMPLE 1

Figure 1:
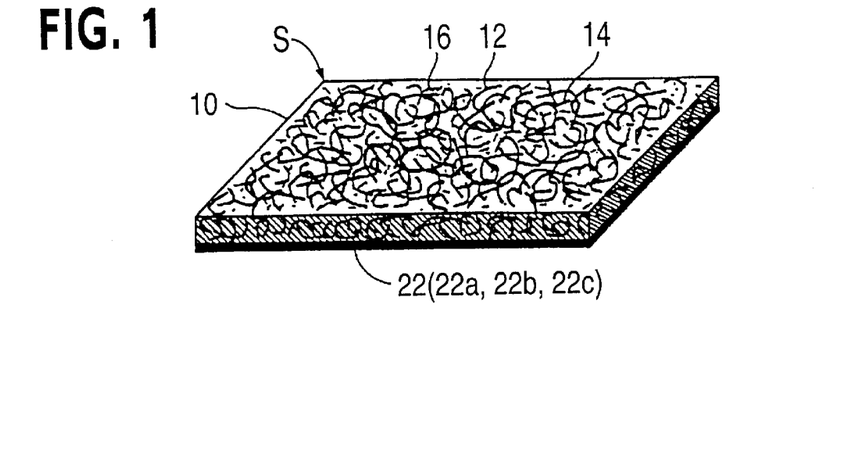
FIG. 1 is a perspective view, partly in section, of an electromagnetic wave absorbing sheet of this invention.

A performance test was carried out for the electromagnetic wave absorbing sheet S shown in FIG. 1. In this test, ferritic stainless steels (SUS 430) 12, each having a length of 300 mm and an average thickness of 30 $\mu$m, glass fibers (glass wool) and a mass ratio of 30% of polyester fibers to the glass fibers were mixed and supplied into a nonwoven fabric sheet machine to obtain a 300 mm square nonwoven fabric sheet 10 having a thickness of 10 mm. Four kinds of the nonwoven fabric sheets 10 were produced, and the number of the fiber in-the respective sheets was 80/cc, 230/cc, 360/cc and 55/cc.

An electromagnetic wave absorption quantity of the four nonwoven fabric sheets 10, each of which has an aluminum foil stuck on a bottom surface, was measured by a reflected power measurement in a frequency range between 1–18 GHz.

Figure 7:
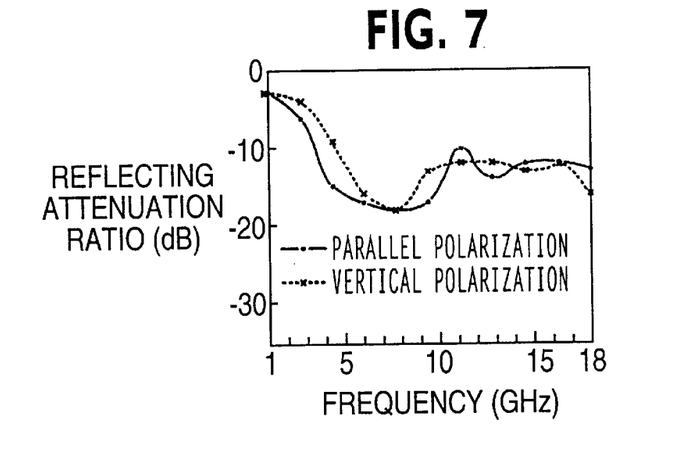
FIG. 7 is a graph showing an absorption quantity in relation to a frequency of an electromagnetic wave absorbing sheet that comprises 230 pc./cc of the shaved metallic fibers.

The calculated result of absorption quantity (return loss; unit dB) of parallel and vertical planes of polarization of the sample having the number of 230/cc is shown in FIG. 7.

No heterotrophy of nonwoven fabric sheet 10 of this invention is recognized, and it can be understood that there is little difference between the parallel and vertical planes of polarization.

A dielectric constant is shown in the following NUMERICAL EXPRESSION 1.

$Er$ (parallel)=8.2–j6.8

$Er$ (vertical)=7.2–j5.5          NUMERICAL EXPRESSION

There is little difference between the parallel and vertical planes of polarization as shown in the NUMERICAL EXPRESSION 1.

As shown in FIG. 7, it can be recognized that the electromagnetic wave absorption quantity in a frequency range below 3–4 GHz lowers, but a favorable and stable value is shown in the frequency range above 3–GHz.

A result showing the value of an average absorption quantity in the frequency range between 3–18 GHz of the sample of this invention is shown in the following TABLE 1.

TABLE 1

| number of fiber/cc | 80 | 230 | 360 | 550 |
|---|---|---|---|---|
| this invention (parallel) | 10 dB | 14 dB | 15 dB | 5 dB |
| this invention (vertical) | 5 dB | 13 dB | 16 dB | 5 dB |
| prior art (parallel) | 6 dB | 14 dB | 16 dB | 5 dB |
| prior art (vertical) | 5 dB | 5 dB | 5 dB | 5 dB |

It can be understood from the foregoing TABLE 1 that the parallel and vertical planes of polarization has a relationship to a manufactured flow of the electromagnetic wave absorbing sheet.

According to this invention, an absorption quantity of the electromagnetic wave absorbing sheet having the metallic fiber more than 80/cc and 50/cc is below 10 dB irrespective of the parallel or vertical planes of polarization, and the absorption quantity of the absorbing sheet having the metallic fiber more than 230/cc and 360/cc has a favorable absorbing performance.

There is a large difference both in the parallel and vertical planes of polarization of the conventional electromagnetic wave absorbing sheet having the metallic fibers of 230/cc and 360/cc., and also a large sheet heterotroiphy is observed.

It is possible to use a ceramic fiber instead of the glass wool for the electromagnetic wave absorbing sheet of this invention, and it is also possible to add the ceramic fiber to the glass wool.

It should be noted that these ceramic fiber and glass wool are fire retarding and heat insulating material by nature so that they exhibit fire retarding and heat insulating performance.

In case fire retarding and heat insulating performance are not necessary, it is possible to use only polyester fiber or the polyester fiber, which is mixed with other synthetic or natural fiber, thus exhibiting the same electromagnetic wave absorbing performance.

EXAMPLE 2

A performance test was carried out for the electromagnetic wave absorbing sheet S comprising other materials shown in FIG. 1.

The shaved metallic fibers 12 of the nonwoven fabric sheet 10 is made of ferritic stainless steels (SUS 430) 12, each having a length of 300 mm and an average thickness of 30 $\mu$m with a mass ratio of 10%, ceramic fiber consisting of alumina and silica, and polyester fibers with a mass ratio of 20% to the glass fibers were mixed and supplied into a nonwoven fabric sheet machine to obtain a 300 mm square nonwoven fabric sheet 10 having a thickness of 10 mm.

A length of the shaved stainless steel fiber 12 in the nonwoven fabric sheet 10 varied from 1–50 mm, and the number thereof was 320/cc.

An aluminum foil 22 was disposed on a bottom surface of the nonwoven fabric sheet 10 to make the electromagnetic wave absorbing sheet S. An electromagnetic wave absorption quantity of the electromagnetic wave absorbing sheet S was measured by a reflected power measurement. As a result, the electromagnetic wave absorption quantity of 12–15 dB was measured in a frequency range between 1–18 GHz.

EXAMPLE 3

A performance test was carried out for the electromagnetic wave absorbing sheet S comprising other materials shown in FIG. 2.

The shaved metallic fibers 12 of the nonwoven fabric sheet 10 comprises ferritic stainless steels (SUS 430) 12, each having a length of 300 mm and an average thickness of 30 $\mu$m, glass fibers (glass wool) with a mass ratio of 20% of polyester fibers to the glass fibers were mixed and supplied into a nonwoven fabric sheet machine to obtain a 300 mm square nonwoven fabric sheet 10 having a thickness of 5 mm.

Three kinds of the nonwoven fabric sheet 10, each containing 2.5%, 5.0% and 7.5% of the shaved metallic fiber 12, were prepared. A length of the shaved stainless steel metallic fiber 12 varied from 1–50 mm, and a number thereof was 180/cc, 300/cc and 440/cc respectively.

The nonwoven fabric sheets 10 were laminated from top to bottom with 180/cc, 300/cc and 440/cc in order and an aluminum foil 22 was disposed on a bottom surface to make an electromagnetic wave absorbing sheet (a).

Reversing the order, the nonwoven fabric sheets 10 were laminated from top to bottom with 400/cc, 300/cc and 180/cc in order and an aluminum foil 22 was stuck on a bottom surface to make an electromagnetic wave absorbing sheet (b).

An electromagnetic wave absorption quantity of the electromagnetic wave absorbing sheets (a) and (b) was measured by a reflected power measurement in a frequency range between 1–18 GHz.

Figure 10:
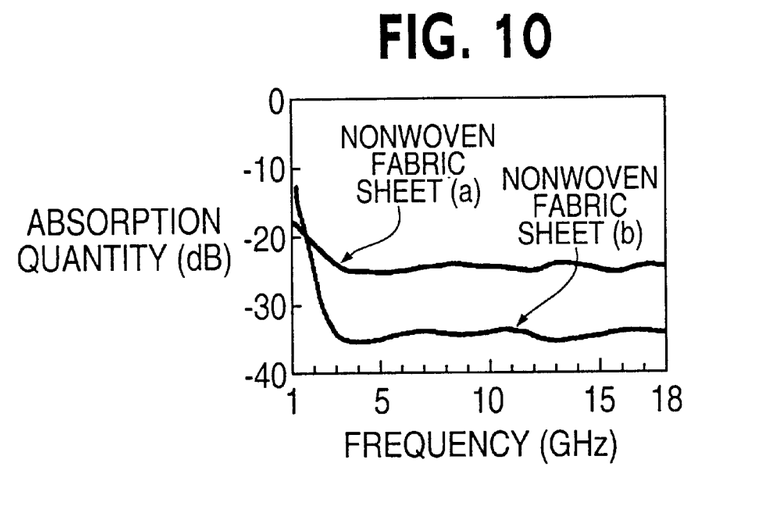
FIG. 10 is a comparative graph showing an absorption quantity in relation to frequencies of three kinds of nonwoven fabric sheet that are laminated integrally.
Figure 11:
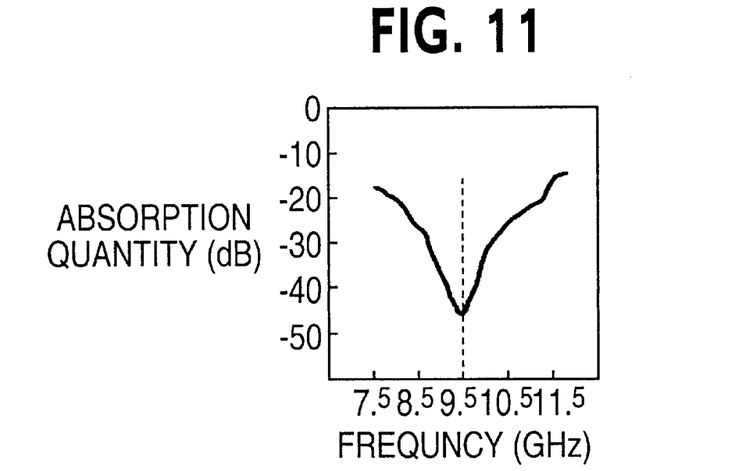
FIG. 11 is a graph showing an absorption quantity in relation to frequency of an electromagnetic wave absorbing sheet.
Figure 12:
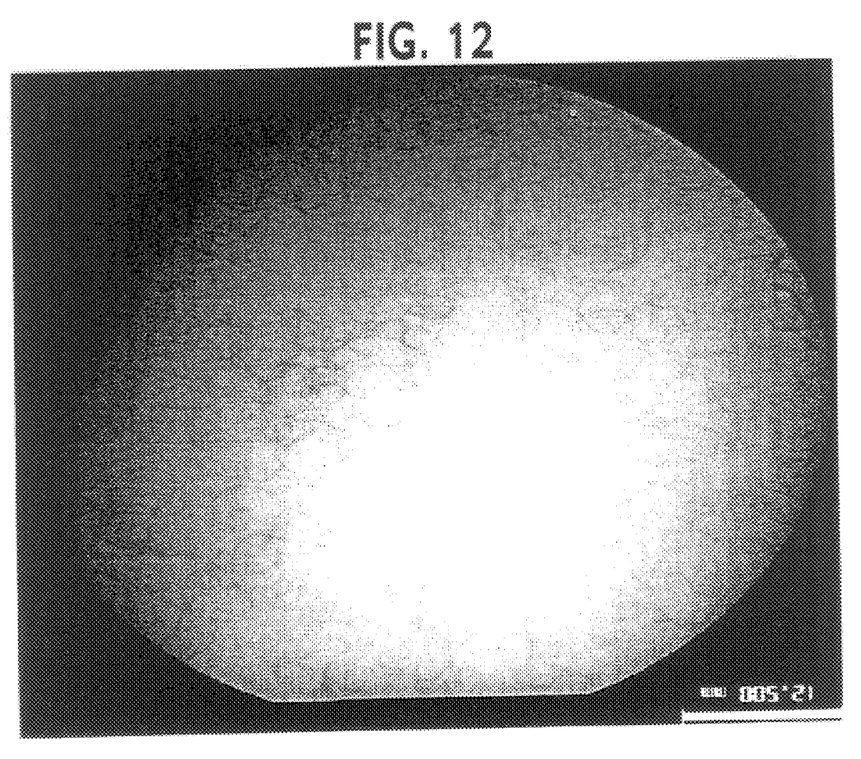
FIG. 12 is an X-ray photograph showing an electromagnetic wave absorbing solid body of this invention.

The measured result of the two electromagnetic wave absorbing sheets (a) and (b) is shown in FIG. 10.

It is understood that the measured value of the electromagnetic wave absorbing sheet (b) shows 25 dB when the shaved metallic fiber 12 containing as many as 440/cc is at a top layer, and the absorbing sheets (a) shows 35 dB when the shaved metallic fiber 12 containing as few as 180/cc is at a top layer of the electromagnetic wave absorbing sheet S.

It is clear from the foregoing paragraph that an excellent electromagnetic wave absorbing performance can be obtained when the nonwoven fabric sheet 10 having a low density is laminated on a top surface of the laminated plural layers of the nonwoven fabric sheet S.

Even when the nonwoven fabric sheet 10 having a high density is laminated on a top surface of a laminated plural layers, the electromagnetic wave absorbing performance exceeds a level of a single layer nonwoven fabric sheet 10 shown in FIG. 7.

It can be understood that a plural layers of the nonwoven fabric sheets 10(a) and (b), each having a different density, exhibit a superior electromagnetic wave absorbing performance to that of a single layer shown in FIG. 7.

EXAMPLE 4

Figure 3:
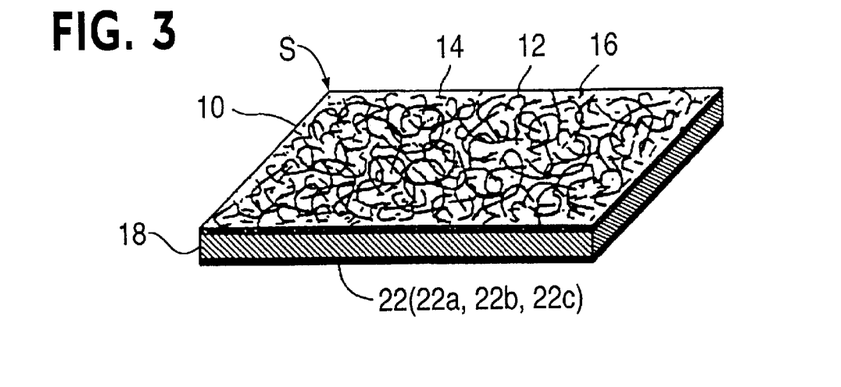
FIG. 3 is a perspective view, partly in section, of an electromagnetic wave absorbing sheet that has a spacing layer sandwiched between a nonwoven fabric sheet and a metallic plate on a bottom surface of the nonwoven fabric sheet.

A performance test was carried out for the electromagnetic wave absorbing sheet S comprising other materials shown in FIG. 3. An absorber having a ¼λ construction, which is known as a resistant membrane absorber was prepared.

The shaved metallic fibers 12, each having a length ranging from 1–50 mm, were mixed into the nonwoven fabric sheet 10 with a ratio of 400/cc, glass fibers (glass wool) and polyester fibers having fiber binding faculty and supplied into a nonwoven fabric sheet machine to make a nonwoven fabric sheet 10 having a thickness of 1.5 mm.

A spacing layer 18, which does not contain the shaved metallic fibers, but contains a glass fiber comprising a polyester fiber and has a thickness of 7.5 mm, was disposed on a bottom surface of the nonwoven fabric sheet, and subsequently an aluminum foil was disposed on the aluminum foil 22b to make an electromagnetic wave absorbing sheet S. As a result, a value of, the electromagnetic wave absorption over 40 dB in a neighboring range of a frequency of 9.5 GHz was measured.

The shaved metallic fibers 12 were made by shaving axially, parallels and repeatedly a top surface of a metallic wire having a circular section with a knife having a fine groove at an angle of a given degree. A cross-section of the shaved metallic fiber 12 changes with a shape of the groove of the knife and a shaving condition to exhibit an irregular cross-section.

Figure 9:
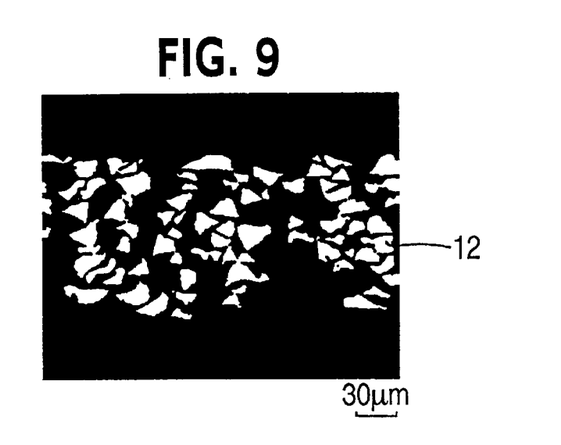
FIG. 9 is a photograph showing the metallic fiber cut into a lateral direction thereof.

An enlarged cross section of the shaved metallic fiber of stainless steel fiber (material: SUS 430) is shown in FIG. 9.

In addition to the above-mentioned irregular cross-section of the shaved metallic fiber and in view of the fact that every shaved metallic fiber has a shearing distortion, there is no linearity thereof and it is curved into a various direction.

The neighboring shaved metallic fibers 12 got entangled with each other. The metallic fiber 12 having such a configuration of this invention cannot be found in the conventional fiber used for electromagnetic wave absorbing sheet, thus contributing to improve heterotrophy of the conventional electromagnetic wave absorbing sheet.

It can be well understood that metal used for the shaved metallic fibers of this invention is conductive irrespective of iron or nonferrous iron, which can be shaved into metallic fibers by a given knife.

In accordance with this invention, the shaved metallic fibers 12, the fiber material 16 such as glass fiber (glass wool), which is a main ingredient and the binding fiber 14 are supplied into a nonwoven fabric sheet machine so that they are torn off to fabricate the shaved metallic fibers, each fiber having the irregular shape.

According to the fabricating condition through the nonwoven fabric sheet machine, the long shaved metallic fibers, which have been first supplied, are cut off to obtain the nonwoven metallic fiber sheet.

Each fiber 12 of the nonwoven metallic fiber sheet S has a various length, exhibiting a random special diffusion, which has no relationship with a flow of the fabricated nonwoven fabric sheet S.

Among the shaved metallic fibers 12 shaved by the shaving wire method, the metallic fibers 12, each fiber having a length less than 1 mm cannot entangle with each other and drop off, and the metallic fibers 12, each fiber having a length more than 50 mm being pressed by drawing.

Figure 6:
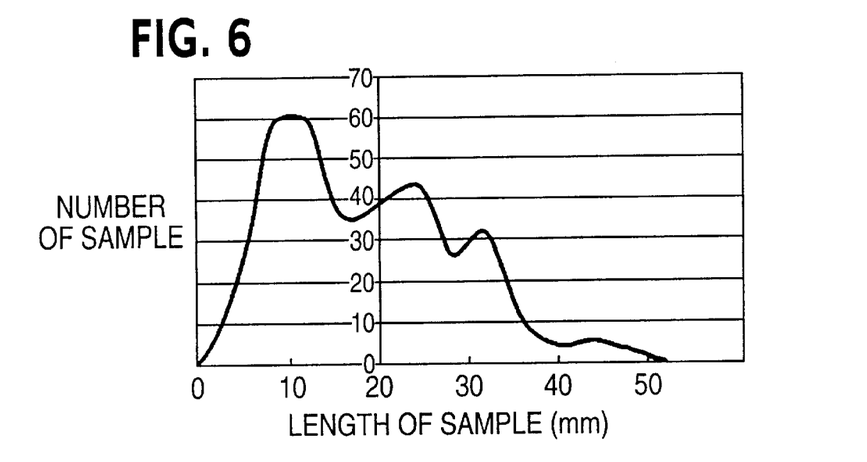
FIG. 6 is a graph showing a distribution of deviation of a length of metallic fiber fabricated by shaving.

FIG. 6, a graph showing a distribution of deviation of a length of a shaved stainless steel metallic fiber (material: SUS 430) having an average length of 300 mm is given.

The shaved stainless steel fibers 12, each fiber having an average of 100 mm (SUS 430) and the fiber material 16 such as glass fiber (glass metallic fibers 12) are cut into comparatively shorter ones.

It means that the more the shaved stainless steel metallic fiber 12 is shorter, the more the number of metallic fibers increase.

Figure 5:
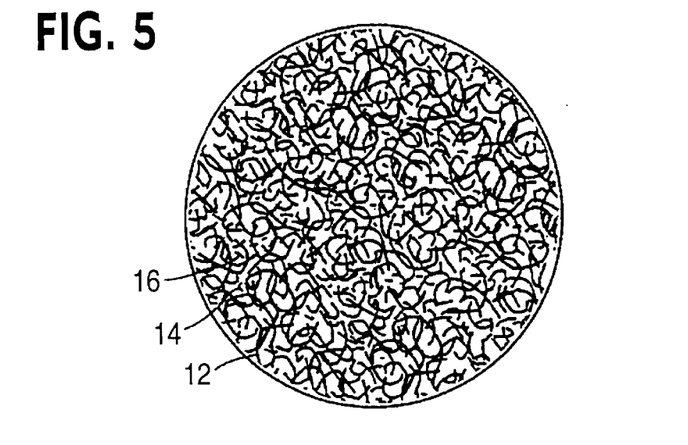
FIG. 5 is an illustration of an X-ray photograph taken from a top surface of a nonwoven fabric sheet.

In order to confirm the number of the shaved steel metallic fiber 12 in the nonwoven fabric sheet S having a given volume, it was photographed by X-ray.

As shown in FIG. 5, the shaved steel metallic fiber 12 are curved and dispersed without any relationship to the flow of fabricating process of the nonwoven fabric sheet S.

The number, length and diameter of the shaved steel metallic fiber 12 in the nonwoven fabric sheet S is measured when a favorable electromagnetic wave absorbing performance is obtained.

In order to measure the diameter of the shaved steel metallic fiber 12, they were embedded vertically into a resin and hardened, and subsequently the hardened resin was cut vertically and polished, a microscope observed the cut surface by magnifying the view.

Figure 8:
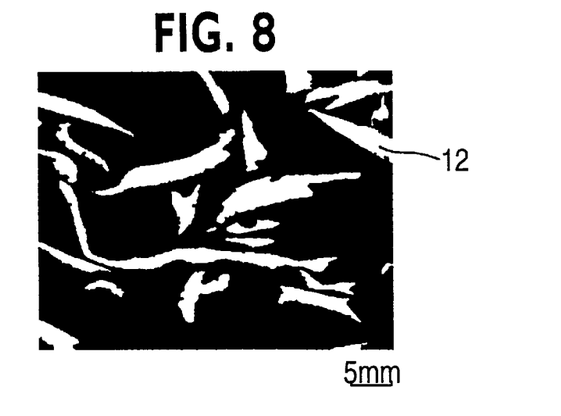
FIG. 8 is a photograph showing the metallic fiber cut into a longitudinal direction thereof.

FIG. 8 is a microscopical photograph of a shaved stainless steel metallic fiber (SUS 430) cut into a longitudinal direction.

FIG. 9 is a similar microscopical photograph of a shaved stainless steel metallic fiber (SUS 430) cut laterally.

The diameter of the shaved stainless steel metallic fiber 12 was arithmetically counted from the sample shown in FIG. 9 at an average diameter of n=30 between a long diameter and a short diameter.

The length and number of the shaved steel metallic fiber 12 was measured by pulling all of the metallic fibers contained in a given domain of the nonwoven fabric sheet S just after it has been fabricated.

As shown in the foregoing example, the electromagnetic wave absorbing performance of the metallic fiber 12 decreases in the sheet S comprising the number of the metallic fiber 12 less than 100 and comprising more than 500 so that these numbers are the upper and lower limits.

Measurement of the absorption quantity of the fabricated electromagnetic wave absorbing sheet S was carried out by a reflected power measurement in an electromagnetic wave chamber, in which an electromagnetic wave was directly radiated into an electromagnetic wave absorber, a reflected level of the electromagnetic wave from a metallic plate having the same area as that of the electromagnetic wave absorber was similarly measured, and an absorption quantity was measured with a comparison of both measured values.

The relationship between the measured value and the absorption quantity was shown in the following TABLE 2.

TABLE 2

$S(dB) = -20 \log^{10} (E/E_0)$
E: reflected quantity of electromagnetic wave absorber
$E_0$: reflected quantity of electromagnetic wave from a metallic plate The shaved steel metallic fiber 12 was crushed and dropped during a process of fabrication when a thickness thereof was below an average diameter of 10 μm.

When the diameter of the shaved steel metallic fiber 12 increases over 70 μm, it does not tear off during fabrication, and its length varies considerably so that the thickness of 70 μm was made an upper limit.

Flexibility of the electromagnetic wave absorbing sheet S was measured for the sheet having a thickness of 10 mm.

The sheet S was cut into a belt having a width of 20 mm which was wound around a round bar having a diameter of 100 mm in order to confirm whether the belt could be wound around the round bar without being bent.

For a typical binding fiber 14, the polyester fiber having a fiber-binding faculty was used, and it is melted in the electromagnetic wave absorbing sheet S when it is heated, thus adhering and combining the adjacent shaved metallic fibers and the fiber material such as organic fiber.

When the amount of these fibers is small, a thickness of the electromagnetic wave absorbing sheet S is damaged so as to decrease a bending property.

On the basis of the foregoing simple winding test around the round bar, a mixture ratio of the binding fiber 14 to the inorganic fiber was decided to 10–40% to keep a flexibility.

As explained in the foregoing paragraphs, heterotrophy of the conventional electromagnetic wave absorbing sheet S made by the shaved metallic fibers 10 made by the shaving wire method.

More than 10 dB (attenuation ratio of 70%) of electromagnetic wave can be absorbed mainly in a frequency range over 3 GHz (preferably 1 GHz) which is radiated from the various electronic machines, thereby protecting a control and performance of the electronic machine from the electromagnetic wave and avoiding an influence of the electromagnetic wave to a daily life.

In comparison to the conventional electromagnetic wave absorbing sheet which has been made by the complicated and expensive process, the electromagnetic wave absorbing sheet S having an excellent electromagnetic wave absorbing performance can be made with a simple and inexpensive method.

Although this invention has been fully described by way of examples with reference to the accompanying drawings, it is to be noted that various changes and modifications will be apparent to those skilled in the art. Therefore, unless otherwise such change and modifications depart from the scope of this invention, they should be construed as being included therein.

What is claimed is:

1. An electromagnetic wave absorbing sheet, which comprises:

a nonwoven fabric sheet including one or a plurality of nonwoven fiber layers, each layer comprising (1) non-metallic fibers having no binding faculty, (2) non-metallic binding fibers having binding faculty which are melted by heat to bind neighboring fibers, and (3) metallic fibers having an irregular shape in cross-section and being produced by shaving a metallic wire or rod, that are dispersed uniformly in said nonwoven fiber layer or layers; and a metallic layer having electromagnetic wave reflecting faculty and disposed on an outer bottom surface of said nonwoven fiber layer or layers.

2. The electromagnetic wave absorbing sheet according to claim 1, which further comprises a nonwoven spacing layer having no metallic fibers disposed between the bottom surface of said nonwoven fiber layer or layers and the metallic layer having electromagnetic wave reflecting faculty.

3. The electromagnetic wave absorbing sheet according to claim 1, wherein said nonwoven fabric sheet has 100 to 500 of said metallic fibers per cubic cm., said metallic fibers having a thickness in a range of 10 to 70 microns and a length of 1 to 50 mm.

4. The electromagnetic wave absorbing sheet according to claim 1, wherein a number of said metallic fibers in each nonwoven fiber layer increases in order from the upper layer to the bottom layer among the plurality of nonwoven fiber layer.

5. The electromagnetic wave absorbing sheet according to claim 1, wherein said metallic fibers are comprised of ferritic stainless steel, iron or copper.

6. The electromagnetic wave absorbing sheet according to claim 1, wherein said binding fibers comprise polyester fibers.

7. The electromagnetic wave absorbing sheet according to claim 1, wherein said non-metallic fiber having no binding faculty is at least one natural or synthetic fiber.

8. The electromagnetic wave absorbing sheet according to claim 1, wherein said metallic layer is a metal plate, metal foil or metal net.

9. The electromagnetic wave absorbing sheet according to claim 1, wherein a top outer surface of said nonwoven fabric sheet is coated with a high polymer membrane.

10. The electromagnetic wave absorbing sheet according to claim 1, wherein said non-metallic fiber having no binding faculty is at least one of glass fibers or polyester fibers.

* * * * *